(12) United States Patent
Hatano

(10) Patent No.: US 12,334,908 B2
(45) Date of Patent: Jun. 17, 2025

(54) BULK ACOUSTIC WAVE FILTERS FOR IMPROVING NOISE FACTOR

(71) Applicant: SKYWORKS SOLUTIONS, INC., Irvine, CA (US)

(72) Inventor: Koichi Hatano, Yokohama (JP)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 157 days.

(21) Appl. No.: 18/059,520

(22) Filed: Nov. 29, 2022

(65) Prior Publication Data

US 2023/0188115 A1 Jun. 15, 2023

Related U.S. Application Data

(60) Provisional application No. 63/288,326, filed on Dec. 10, 2021.

(51) Int. Cl.
*H03H 9/60* (2006.01)
*H03H 9/13* (2006.01)
(Continued)

(52) U.S. Cl.
CPC ............ *H03H 9/605* (2013.01); *H03H 9/133* (2013.01); *H03H 9/587* (2013.01); *H03H 9/74* (2013.01)

(58) Field of Classification Search
CPC .... H03H 9/173; H03H 9/02118; H03H 9/175; H03H 3/02; H03H 9/605; H03H 9/132; H03H 9/568; H03H 2003/021; H03H 9/131; H03H 9/564; H03H 9/02157; H03H 9/706; H03H 9/02015; H03H 9/6483; H03H 9/174; H03H 9/54; H03H 9/02102; H03H 9/0211; H03H 9/13; H03H 9/725; H03H 2003/023; H03H 9/02086; H03H 9/171; H03H 9/205; H03H 9/0014
See application file for complete search history.

(56) References Cited

U.S. PATENT DOCUMENTS 7,358,831 B2 4/2008 Larson, III et al.
9,385,303 B2 7/2016 Song et al.
(Continued)

FOREIGN PATENT DOCUMENTS

CN 111786645 A 10/2020
JP 2002374144 A 12/2002
(Continued)

OTHER PUBLICATIONS

Li et al., "Use of double-raised-border structure for quality factor enhancement of type II piston mode FBAR", Microsystem Technologies, Berlin, Germany, vol. 24, No. 7, May 2018, pp. 2991-2997.

*Primary Examiner* — Lincoln D Donovan
*Assistant Examiner* — Tyler J Pereny
(74) *Attorney, Agent, or Firm* — Lando & Anastasi, LLP

(57) ABSTRACT

A ladder type acoustic wave filter is disclosed. The acoustic wave filter can include a plurality of parallel arm resonators and a plurality of series arm resonators, in which an electromechanical coupling coefficient of a parallel arm resonator closest to an input node of the acoustic wave filter among the plurality of parallel arm resonators can be smaller than an electromechanical coupling coefficient of a series arm resonator closest to the input node among the plurality of series arm resonators.

16 Claims, 11 Drawing Sheets

(51) Int. Cl.
*H03H 9/58* (2006.01)
*H03H 9/74* (2006.01)

(56) References Cited

U.S. PATENT DOCUMENTS

| | | |
|---|---|---|
| 9,401,692 B2 | 7/2016 | Burak et al. |
| 9,425,764 B2 | 8/2016 | Burak et al. |
| 9,444,426 B2 | 9/2016 | Burak et al. |
| 9,484,882 B2 | 11/2016 | Burak et al. |
| 9,490,771 B2 | 11/2016 | Burak et al. |
| 9,853,626 B2 | 12/2017 | Burak et al. |
| 9,991,871 B2 | 6/2018 | Zou et al. |
| 10,284,173 B2 | 5/2019 | Burak et al. |
| 10,367,472 B2 | 7/2019 | Burak et al. |
| 10,404,231 B2 | 9/2019 | Burak et al. |
| 10,608,611 B2 | 3/2020 | Tajic et al. |
| 10,756,702 B2 | 8/2020 | Lee et al. |
| 10,812,037 B2 | 10/2020 | Kyoung et al. |
| 11,050,409 B2 | 6/2021 | Park et al. |
| 11,082,023 B2 | 8/2021 | Shin et al. |
| 11,190,164 B2 | 11/2021 | Yen et al. |
| 11,482,985 B2 | 10/2022 | Fries et al. |
| 11,502,667 B2 | 11/2022 | Tajic et al. |
| 11,601,113 B2 | 3/2023 | Wang et al. |
| 2007/0057599 A1 | 3/2007 | Motai et al. |
| 2008/0024042 A1 | 1/2008 | Isobe et al. |
| 2008/0174389 A1 | 7/2008 | Mori et al. |
| 2009/0001848 A1 | 1/2009 | Umeda et al. |
| 2010/0013573 A1 | 1/2010 | Umeda |
| 2011/0180391 A1 | 7/2011 | Larson, III et al. |
| 2011/0304412 A1 | 12/2011 | Zhang |
| 2012/0200195 A1 | 8/2012 | Yokoyama et al. |
| 2013/0033337 A1 | 2/2013 | Nishihara et al. |
| 2013/0063227 A1 | 3/2013 | Burak et al. |
| 2013/0106248 A1 | 5/2013 | Burak et al. |
| 2013/0140959 A1 | 6/2013 | Shin et al. |
| 2013/0193809 A1 | 8/2013 | Araki |
| 2014/0118091 A1 | 5/2014 | Burak et al. |
| 2014/0118092 A1 | 5/2014 | Burak et al. |
| 2014/0167566 A1 | 6/2014 | Kando |
| 2014/0203684 A1 | 7/2014 | Yamamoto et al. |
| 2014/0203686 A1 | 7/2014 | Song et al. |
| 2014/0292150 A1 | 10/2014 | Zou et al. |
| 2014/0339959 A1 | 11/2014 | Lee et al. |
| 2015/0214923 A1* | 7/2015 | Tsuzuki ............... H03H 9/605 333/186 |
| 2016/0028371 A1 | 1/2016 | Nishihara et al. |
| 2016/0118957 A1 | 4/2016 | Burak et al. |
| 2016/0118958 A1 | 4/2016 | Burak et al. |
| 2016/0164487 A1 | 6/2016 | Shin et al. |
| 2017/0033769 A1 | 2/2017 | Yokoyama |
| 2017/0093374 A1 | 3/2017 | Yatsenko et al. |
| 2017/0214388 A1 | 7/2017 | Irieda et al. |
| 2017/0244387 A1* | 8/2017 | Matsuda ............... H03H 9/173 |
| 2017/0288121 A1 | 10/2017 | Burak et al. |
| 2017/0288122 A1 | 10/2017 | Zou et al. |
| 2017/0331457 A1 | 11/2017 | Satoh |
| 2018/0013401 A1 | 1/2018 | Lee et al. |
| 2018/0048287 A1 | 2/2018 | Lee et al. |
| 2018/0085787 A1 | 3/2018 | Burak et al. |
| 2018/0115302 A1 | 4/2018 | Yeh et al. |
| 2018/0219528 A1 | 8/2018 | Liu et al. |
| 2018/0254764 A1 | 9/2018 | Lee et al. |
| 2018/0278231 A1 | 9/2018 | Hurwitz |
| 2018/0309427 A1 | 10/2018 | Kim et al. |
| 2018/0351533 A1 | 12/2018 | Lee et al. |
| 2019/0036592 A1 | 1/2019 | Shealy et al. |
| 2019/0115901 A1 | 4/2019 | Takahashi et al. |
| 2019/0326873 A1 | 10/2019 | Bradley et al. |
| 2019/0363692 A1* | 11/2019 | Nosaka .............. H03H 9/14541 |
| 2020/0021273 A1 | 1/2020 | Sung et al. |
| 2020/0083861 A1 | 3/2020 | Matsuo et al. |
| 2020/0099359 A1 | 3/2020 | Shin et al. |
| 2020/0119713 A1 | 4/2020 | Kim et al. |
| 2020/0168785 A1 | 5/2020 | Ikeuchi et al. |
| 2020/0204148 A1 | 6/2020 | Kim et al. |
| 2020/0350888 A1 | 11/2020 | Moulard |
| 2020/0366266 A1 | 11/2020 | Pollard et al. |
| 2020/0366271 A1 | 11/2020 | Kim et al. |
| 2020/0373901 A1 | 11/2020 | Liu et al. |
| 2020/0373911 A1 | 11/2020 | Wang et al. |
| 2021/0028765 A1 | 1/2021 | Wang et al. |
| 2021/0083643 A1 | 3/2021 | Liu et al. |
| 2022/0368312 A1 | 11/2022 | Wang et al. |
| 2022/0393664 A1 | 12/2022 | Liu et al. |
| 2023/0006642 A1 | 1/2023 | Liu et al. |
| 2023/0109382 A1 | 4/2023 | Liu et al. |
| 2023/0261637 A1 | 8/2023 | Matsuo et al. |
| 2023/0299744 A1 | 9/2023 | Zhang et al. |

FOREIGN PATENT DOCUMENTS

| | | |
|---|---|---|
| JP | 2007208845 A | 8/2007 |
| JP | 2007288645 A | 11/2007 |
| JP | 2014090414 A | 5/2014 |
| WO | 2006129532 A1 | 12/2006 |
| WO | 2007119556 A1 | 10/2007 |
| WO | 2008126473 A1 | 10/2008 |
| WO | 2019029912 A1 | 2/2019 |

* cited by examiner

BULK ACOUSTIC WAVE FILTERS FOR IMPROVING NOISE FACTOR

CROSS-REFERENCE TO RELATED APPLICATIONS

This application claims priority under 35 U.S.C. § 119(e) to U.S. Provisional Patent Application Ser. No. 63/288,326, titled "BULK ACOUSTIC WAVE FILTERS FOR IMPROVING NOISE FACTOR," filed Dec. 10, 2021, the entire contents of which is incorporated herein by reference for all purposes.

BACKGROUND

Technical Field

Embodiments of this disclosure relates to an acoustic wave filter, and, in particular, to a film bulk acoustic wave filter including a film bulk acoustic wave resonator (FBAR).

Description of Related Technology

An acoustic wave filter such as a bulk acoustic wave (BAW) filter can be used as a filter in a radio frequency electronic system. For instance, filters in a radio frequency front end of a mobile phone can include acoustic wave filters. Two acoustic wave filters can be arranged as a duplexer.

SUMMARY

In one aspect, there is provided a ladder type acoustic wave filter. The acoustic wave filter includes a plurality of parallel arm resonators and a plurality of series arm resonators, in which an electromechanical coupling coefficient of a parallel arm resonator closest to an input node of the acoustic wave filter among the plurality of parallel arm resonators is smaller than an electromechanical coupling coefficient of a series arm resonator closest to the input node among the plurality of series arm resonators.

The plurality of parallel arm resonators and the plurality of series arm resonators can be formed from film bulk acoustic wave resonators. Each film bulk acoustic wave resonator includes a substrate, a piezoelectric film supported over a top surface of the substrate and over a cavity defined between the piezoelectric film and the substrate, and an electrode layer disposed on a surface opposite to the piezoelectric film. The parallel arm resonator closest to the input node includes a first low propagation velocity region extending along a periphery of an active region of the piezoelectric film that can oscillate. The series arm resonator closest to the input node includes a second low propagation velocity region extending along a periphery of the active region of the piezoelectric film that can oscillate. The first low propagation velocity region can have a width greater than the width of the second low propagation velocity region. The electromechanical coupling coefficient of the film bulk acoustic wave resonator can be a decreasing function of the width of the low propagation velocity region in the film bulk acoustic wave resonator.

The parallel arm resonator closest to the input node can include a first raised frame portion extending along the periphery of the active region of the piezoelectric film that can oscillate, in which the first raised frame portion is formed by a portion of the electrode layer disposed on a top surface of the piezoelectric film. The series arm resonator closest to the input node can include a second raised frame portion extending along the periphery of the active region of the piezoelectric film that can oscillate, in which the second raised frame portion is formed by a portion of the electrode layer disposed on a top surface of the piezoelectric film. The region of the piezoelectric film in which the first raised frame portion is formed and the region of the piezoelectric film in which the second raised frame portion is formed can correspond to the first low propagation velocity region and the second low propagation velocity region, respectively. The width of the first raised frame portion can be greater than the width of the second raised frame portion. The electromechanical coupling coefficient of the film bulk acoustic wave resonator can be a decreasing function of the width of the raised frame portion in the film bulk acoustic wave resonator.

Each of the parallel arm resonator closest to the input node and the series arm resonator closest to the input node can include a recessed frame portion defined in the electrode layer. The recessed frame portion is adjacent to an inside of a raised frame portion of the electrode layer disposed on a top surface of the piezoelectric film. At least some of the plurality of film bulk acoustic wave resonators can be disposed on a single substrate.

According to an embodiment, an acoustic wave filter assembly includes a first acoustic wave filter coupled to a common node and a second acoustic wave filter coupled to the common node. At least one of the first and second acoustic wave filters is the acoustic wave filter. The acoustic wave filter assembly can include a third acoustic wave filter coupled to the common node and a fourth acoustic wave filter coupled to the common node.

According to an embodiment, a wireless communication device comprises an antenna, and a multiplexer coupled to the antenna, the multiplexer including a plurality of filters coupled to a common node and arranged to filter a radio frequency signal, at least one of the plurality of filters including a plurality of parallel arm resonators, and a plurality of series arm resonators, an electromechanical coupling coefficient of a parallel arm resonator closest to an input node of the acoustic wave filter among the plurality of parallel arm resonators being smaller than an electromechanical coupling coefficient of a series arm resonator closest to the input node of the acoustic wave filter among the plurality of series arm resonators.

The plurality of parallel arm resonators and the plurality of series arm resonators may be formed from film bulk acoustic wave resonators.

Each of the film bulk acoustic wave resonators may comprise a substrate, a piezoelectric film supported over the substrate and over cavity defined between the piezoelectric film and the substrate, and an electrode layer disposed on a surface opposing the piezoelectric film, the film bulk acoustic wave resonator of the parallel arm resonator closest to the input node including a first low propagation velocity region extending along a periphery of an active region of the piezoelectric film that can oscillate, and the film bulk acoustic wave resonator of the series arm resonator closest to the input node including a second low propagation velocity region extending along a periphery of an active region of the piezoelectric film that can oscillate, a width of the first low propagation velocity region being greater than a width of the second low propagation velocity region.

An electromechanical coupling coefficient of each of the film bulk acoustic wave resonators may be a decreasing function of the width of the low propagation region in the respective film bulk acoustic wave resonator.

The film bulk acoustic wave resonator of the parallel arm resonator closest to the input node may include a first raised frame portion extending along the periphery of the active region of the piezoelectric film that can oscillate, the first raised frame portion being formed by a portion of the electrode layer disposed on a top surface of the piezoelectric film, and the film bulk acoustic wave resonator of the series arm resonator closest to the input node includes a second raised frame portion extending along the periphery of the active region of the piezoelectric film that can oscillate, in which the second raised frame portion is formed by a portion of the electrode layer disposed on a top surface of the piezoelectric film, a region of the piezoelectric film in which the first raised frame portion is formed and a region of the piezoelectric film in which the second raised frame portion is formed corresponding to the first low propagation velocity region and the second low propagation velocity region, respectively.

A width of the first raised frame portion may be greater than a width of the second raised frame portion.

An electromechanical coupling coefficient of each of the film bulk acoustic wave resonators may be a decreasing function of the width of the raised frame portion in the respective film bulk acoustic wave resonator.

Each of the parallel arm resonator closest to the input node and the series arm resonator closest to the input node may include a recessed frame portion of the electrode layer, the recessed frame portion being adjacent to an inside of the raised frame portion of the electrode layer disposed on the top surface of the piezoelectric film.

At least some of the respective film bulk acoustic wave resonators may be disposed on a single substrate.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1:
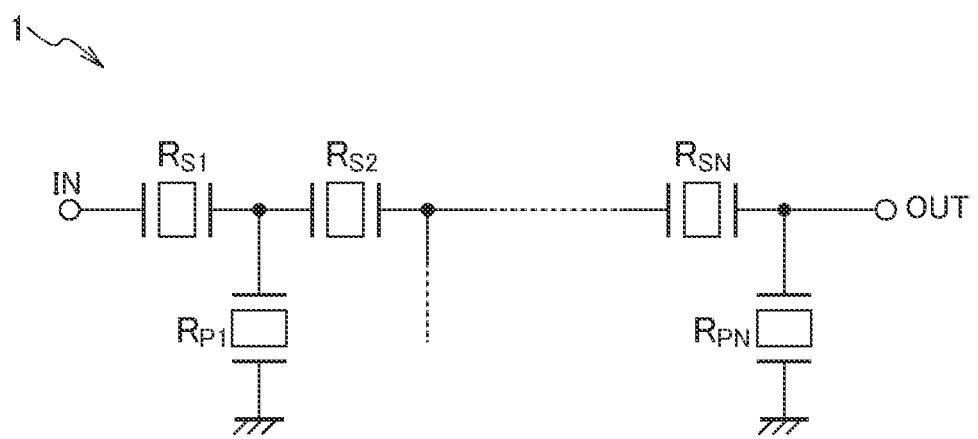
FIG. 1 is a circuit diagram of an embodiment of a film bulk acoustic wave filter.

The following description of certain embodiments presents various descriptions of specific embodiments. However, the innovations described herein can be embodied in a multitude of different ways, for example, as defined and covered by the claims. In this description, reference is made to the drawings in which like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Film Bulk Acoustic Wave Filters

FIG. 1 is a circuit diagram of a film bulk acoustic wave filter 1 according to an embodiment. The film bulk acoustic wave filter 1 is generally configured as a ladder-type filter in which a plurality of series arms extend from an input node IN to an output node OUT and series film bulk acoustic wave resonators (FBARs) are arranged along respective series arms as first series FBAR $R_{S1}$ to Nth series FBAR $R_{SN}$. A plurality of parallel arms extend from respective nodes between respective series FBARs to ground. Parallel FBARs are arranged along respective parallel arms as first parallel FBAR $R_{P1}$ to Nth parallel FBAR $R_{PN}$. In the film bulk acoustic wave filter 1, an electromechanical coupling coefficient of the first parallel FBAR $R_{P1}$ disposed at the parallel arm closest to the input node IN is smaller than the electromechanical coupling coefficient of the first series FBAR $R_{S1}$ disposed at the series arm closest to the input node IN.

An FBAR is one type of bulk acoustic wave (BAW) resonator including a piezoelectric film. The piezoelectric film is provided with a top electrode layer and a bottom electrode layer on opposite surfaces of the piezoelectric film and is suspended over a cavity allowing the piezoelectric film to oscillate. A signal applied between the top electrode layer and the bottom electrode layer can generate an acoustic wave in the piezoelectric film and the acoustic wave can propagate through the film. The first series FBAR $R_{S1}$ to the Nth series FBAR $R_{SN}$ and the first parallel FBAR $R_{P1}$ to the Nth parallel FBAR $R_{PN}$ can exhibit a frequency response to an applied signal, respectively. The frequency response has a resonant peak determined by a thickness of the piezoelectric film. The first series FBAR $R_{S1}$ to the Nth series FBAR $R_{SN}$ and the first parallel FBAR $R_{P1}$ to the Nth parallel FBAR $R_{PN}$ that form the film bulk acoustic wave filter 1 can be disposed on the same substrate, each FBAR can be formed as a distinct element, or some FBARs can be disposed on the same substrate.

Figure 2A:
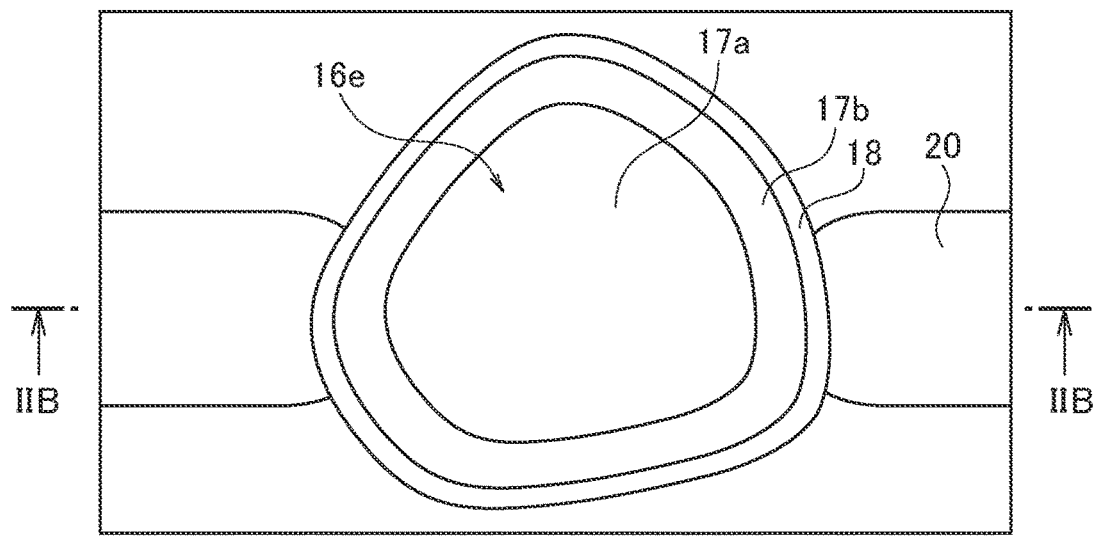
FIG. 2A is a top view of a film bulk acoustic wave resonator (FBAR) included in an embodiment of a film bulk acoustic wave filter.
Figure 2B:
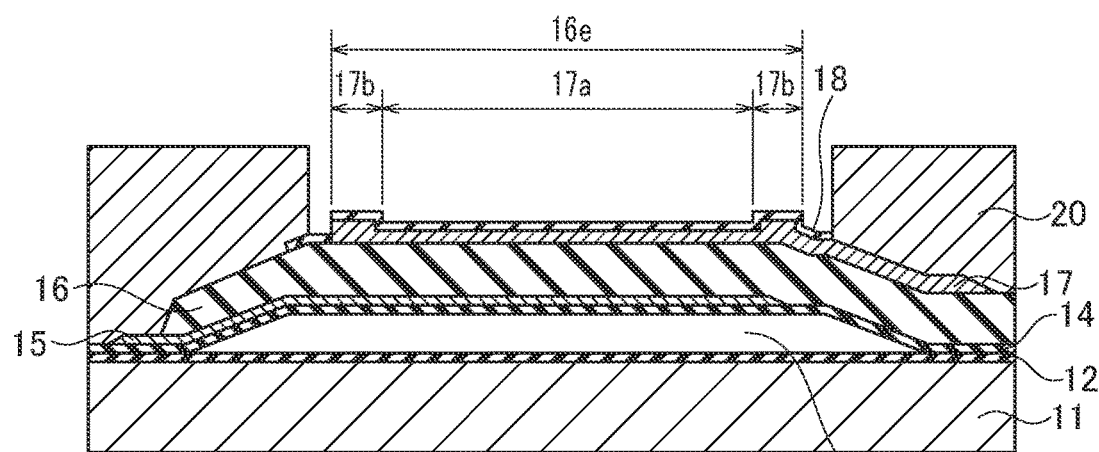
FIG. 2B is a cross-sectional view of the FBAR of FIG. 2A taken along the lines IIB-IIB.

FIG. 2A is a top view of a typical FBAR that may be included in the film bulk acoustic wave filter 1 of an embodiment and FIG. 2B is a cross-sectional view of the typical FBAR. The cross-sectional view of FIG. 2B shows a cross-section taken along the lines IIB-IIB in the top view of FIG. 2A. FIGS. 2A and 2B show the first series FBAR $R_{S1}$, which is a typical FBAR included in the film bulk acoustic wave filter 1 that is closest to the input node IN in the film bulk acoustic wave filter 1.

Although the substrate 11 in this FBAR is assumed to be formed from silicon, the substrate 11 can be formed from aluminum nitride, silicon nitride, magnesium oxide spinel, magnesium oxide crystal, sapphire, and the like. A top surface of the substrate 11 can be a main surface of the substrate 11. The main surface can be covered with a first passivation layer 12, for example, a silicon oxide layer. A piezoelectric film 16 is formed over a region of the main surface as a dome structure that is raised and defines a cavity 101 above the main surface. The piezoelectric film 16 can be formed from a piezoelectric material such as aluminum nitride (AlN), zinc oxide (ZnO), and the like. The piezoelectric film 16 can be doped with an additive such as scandium (Sc). The piezoelectric film 16 has a bottom surface, on which a bottom electrode layer 15 is disposed to extend from a periphery of the piezoelectric film 16 to an active region of the piezoelectric film 16 that can oscillate. The bottom surface of the piezoelectric film 16 can be covered with a second passivation layer 14, for example, a silicon oxide layer. The second passivation layer 14 can also cover the bottom electrode layer 15. A top electrode layer 17 is disposed on a top surface of the active region 16e of the piezoelectric film 16 to oppose the bottom electrode layer 15. A wiring layer 20 is disposed on the top surface of the piezoelectric film 16 to be connected to the bottom electrode layer 15 and the top electrode layer 17. A periphery of the top surface of the piezoelectric film 16 along which the wiring layer 20 is not formed can be covered with a third passivation layer 18, for example, a silicon nitride layer. The bottom electrode layer 15 and the top electrode layer 17 are configured to apply a voltage to the piezoelectric film 16 and excite the piezoelectric film 16 and also to extract a voltage generated by the piezoelectric film 16. The bottom electrode layer 15 and the top electrode layer 17 can be formed from a metal such as copper. The wiring layer 20 can be formed from a metal such as copper or titanium.

The active region 16e of the piezoelectric film 16 is a region that can oscillate by being supported by a circumference of the piezoelectric film 16 that is connected to the main surface of the substrate 11. The active region 16e can be caused to oscillate in a direction normal to the main surface of the substrate 11 by a voltage applied across the bottom electrode layer 15 and the top electrode layer 17. The active region 16e can substantially correspond to a portion opposing the main surface of the substrate 11 via the cavity 101. As shown in FIG. 2A, the active region 16e is formed to have a distorted shape, the surrounding contour of which is asymmetric in plan view, such that a stationary wave cannot be generated by the oscillation. It is to be understood that the contour shape of the piezoelectric film 16 shown in FIG. 2A is for illustrative purpose only and thus is not necessarily limited to this shape. The top electrode layer 17 can include a planar portion 17a and a raised frame portion 17b. The planar portion 17a is formed to have a certain height from the top surface of the piezoelectric film 16 mainly for covering the active region 16e. The raised frame portion 17b is formed to extend along a periphery of the piezoelectric film 16 having a top surface raised at a certain height from the planar portion 17a across a certain width.

Figure 2C:
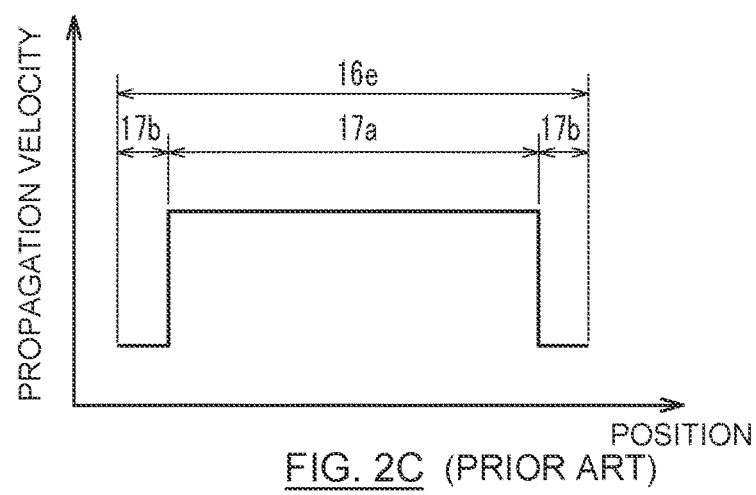
FIG. 2C is a graph showing a propagation velocity distribution of an oscillation on a piezoelectric film of the FBAR of FIGS. 2A and 2B.

FIG. 2C is a graph showing a propagation velocity or acoustic velocity of the oscillation as a function of a horizontal position across the plane of the piezoelectric film 16 of the typical FBAR shown in FIGS. 2A and 2B. The positional region 16e and sequential positional regions 17b, 17a, and 17b shown in FIG. 2C correspond to the positional region 16e and sequential positional regions 17b, 17a, and 17b shown in FIG. 2B, respectively. As shown in FIG. 2C, across the active region 16e of the piezoelectric film 16, the propagation velocity of the oscillation generated by the piezoelectric film 16 in the region where the raised frame portion 17b is formed is lower than a constant propagation velocity in the region where the planar portion 17a is formed. The propagation velocity of the oscillation generated by the piezoelectric film 16 is maintained lower in the raised frame portion 17b surrounding the planar portion 17a, and accordingly, the oscillation energy of the piezoelectric film 16 can be confined within the planar portion 17a. This confinement can suppress a dissipation of the oscillation energy of the piezoelectric film 16 and thus the energy conversion efficiency of the FBAR can be maintained at a certain level.

Although FIGS. 2A and 2B show the first series FBAR $R_{S1}$ closest to the input node IN as a typical FBAR, another FBAR can have a similar structure in the film bulk acoustic wave filter 1. It should be noted that, in other FBARs, specific structures such as a shape of the active region 16e, and the width of the raised frame portion 17b can vary. Also, characteristics such as resonance frequency in the other FBARs can be different.

Figure 3A:
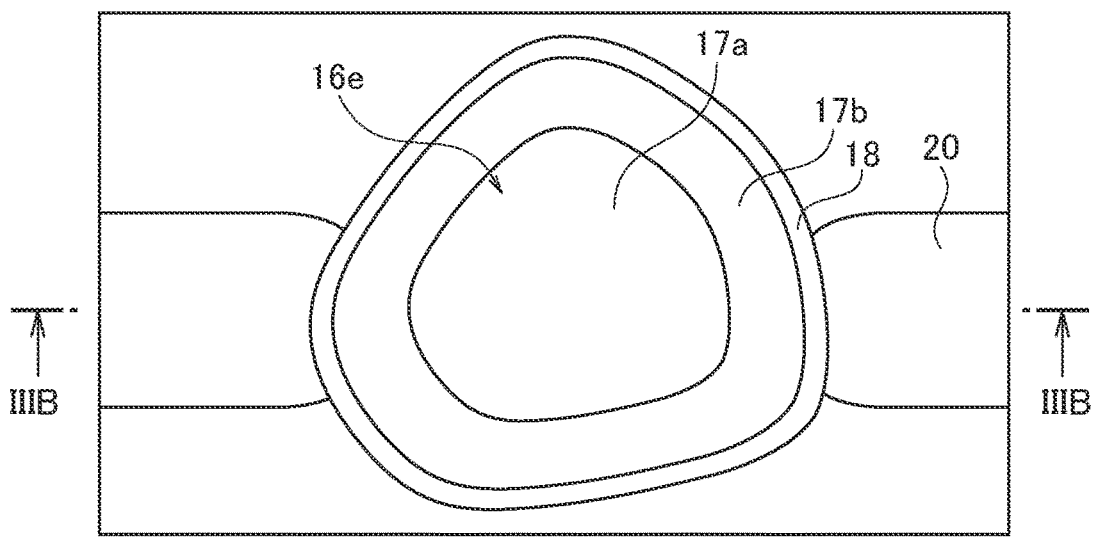
FIG. 3A is a top view of a FBAR forming a parallel arm resonator closest to an input node in a film bulk acoustic wave filter according to an embodiment.
Figure 3B:
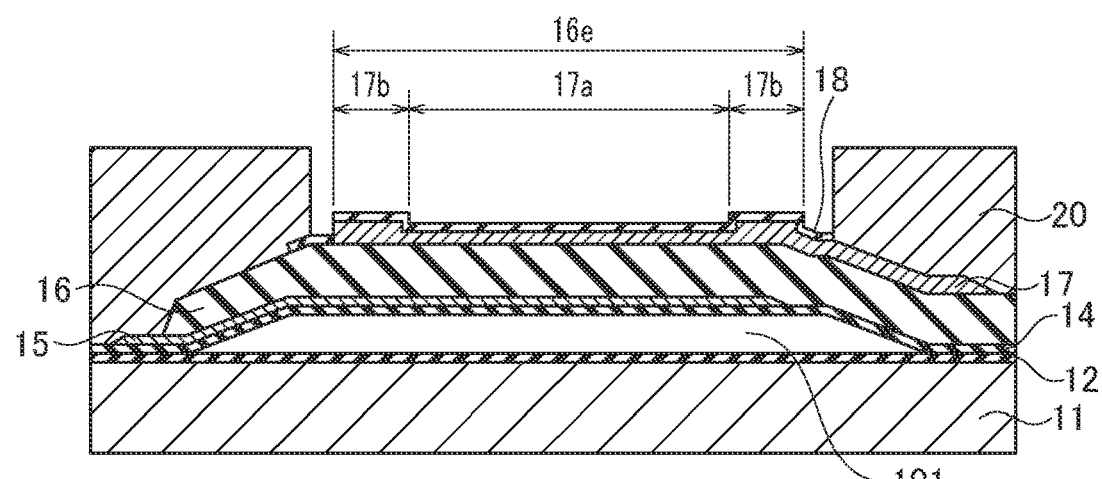
FIG. 3B is a cross-sectional view of the FBAR of FIG. 3A taken along the lines IIIB-IIIB.

FIG. 3A is a top view of the first parallel FBAR $R_{P1}$ and FIG. 3B is a cross-sectional view of the first parallel FBAR $R_{P1}$. The cross-sectional view of FIG. 3B shows a cross-section taken along the lines IIIB-IIIB in the top view of FIG. 3A. The first parallel FBAR $R_{P1}$ is similar to the first series FBAR $R_{S1}$ shown as a typical FBAR in FIGS. 2A and 2B except for the structure of the top electrode layer 17. In FIGS. 3A and 3B, like reference numerals are used to indicate identical components shown in FIGS. 2A and 2B to clarify the correspondence relationships.

Although the substrate 11 in the first parallel FBAR $R_{P1}$ is assumed to be formed from silicon, the substrate 11 can be formed from aluminum nitride, silicon nitride, magnesium oxide spinel, magnesium oxide crystal, sapphire, and the like. A top surface of the substrate 11 can be a main surface of the substrate 11. The main surface can be covered with a first passivation layer 12, for example, a silicon oxide layer. A piezoelectric film 16 is formed over a region of the main surface as a dome structure that is raised and defines a cavity 101 above the main surface. The piezoelectric film 16 can be formed from a piezoelectric material such as aluminum nitride (AlN), zinc oxide (ZnO), and the like. The piezoelectric film 16 can be doped with an additive such as scandium (Sc). The piezoelectric film 16 has a bottom surface, on which a bottom electrode layer 15 is disposed to extend from a periphery of the piezoelectric film 16 to an active region of the piezoelectric film 16 that can oscillate. The bottom surface of the piezoelectric film 16 can be covered with a second passivation layer 14, for example, a silicon oxide layer. The second passivation layer 14 can also cover the bottom electrode layer 16. A top electrode layer 17 is disposed on a top surface of the active region 16e of the piezoelectric film 16 to oppose the bottom electrode layer 15. A wiring layer 20 is disposed on the top surface of the piezoelectric film 16 to be connected to the bottom electrode layer 15 and the top electrode layer 17. A periphery of the top surface of the piezoelectric film 16 along which the wiring layer 20 is not formed can be covered with a third passivation layer 18, for example, a silicon nitride layer. The bottom electrode layer 15 and the top electrode layer 17 are configured to apply a voltage to the piezoelectric film 16 and excite the piezoelectric film 16 and also to extract a voltage generated by the piezoelectric film 16. The bottom electrode layer 15 and the top electrode layer 17 can be formed from a metal such as copper. The wiring layer 20 can be formed from a metal such as copper or titanium.

The active region 16e of the piezoelectric film 16 is a region that can oscillate by being supported by a circumference of the piezoelectric film 16 that is connected to the main surface of the substrate 11. The active region 16e can be caused to oscillate in a direction normal to the main surface of the substrate 11 by a voltage applied across the bottom electrode layer 15 and the top electrode layer 17. The active region 16e can substantially correspond to a portion opposing the main surface of the substrate 11 via the cavity 101. As shown in FIG. 3A, the active region 16e is formed to have a distorted shape the surrounding contour of which is asymmetric in plan view such that a stationary wave cannot be generated by the oscillation. It is to be understood that the contour shape of the piezoelectric film 16 shown in FIG. 3A is for illustrative purpose only and thus is not necessarily limited to this shape. The top electrode layer 17 can include a planar portion 17a and a raised frame portion 17b. The planar portion 17a is formed to have a certain height from the top surface of the piezoelectric film 16 mainly for covering the active region 16e. The raised frame portion 17b is formed to extend along a periphery of the piezoelectric film 16 having a top surface raised at a certain height from the planar portion 17a across a certain width. The raised frame portion 17b of the first parallel FBAR $R_{P1}$ is wider than the raised frame portion 17b of the first series FBAR $R_{S1}$ shown in FIGS. 2A and 2B.

Figure 3C:
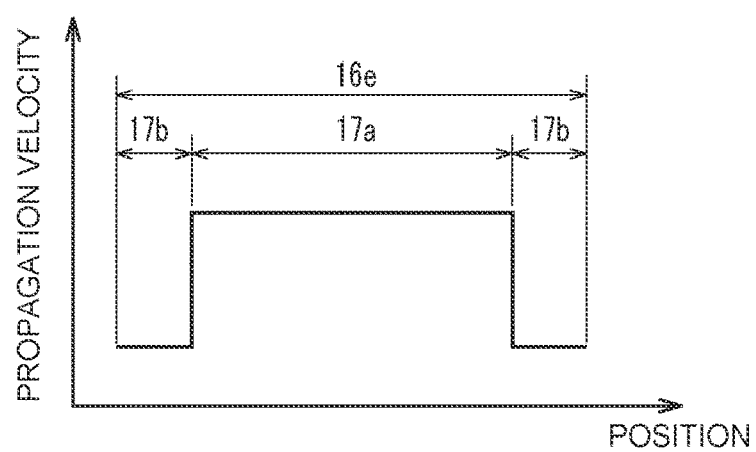
FIG. 3C is a graph showing a propagation velocity distribution of an oscillation on a piezoelectric film of the FBAR of FIGS. 3A and 3B.

FIG. 3C is a graph showing a propagation velocity or acoustic velocity of the oscillation as a function of a horizontal position across the plane of the piezoelectric film 16 of the example FBAR shown in FIGS. 3A and 3B. The positional region 16e and sequential positional regions 17b, 17a, and 17b shown in FIG. 3C correspond to the positional region 16e and sequential positional regions 17b, 17a, and 17b shown in FIG. 3B, respectively. As shown in FIG. 3C, across the active region 16e of the piezoelectric film 16, the propagation velocity of the oscillation generated by the piezoelectric film 16 in the region where the raised frame portion 17b is formed is lower than a constant propagation velocity in the region where the planar portion 17a is formed. The propagation velocity of the oscillation generated by the piezoelectric film 16 is maintained lower in the raised frame portion 17b surrounding the planar portion 17a, and accordingly, the oscillation energy of the piezoelectric film 16 can be confined within the planar portion 17a. This confinement can suppress a dissipation of the oscillation energy of the piezoelectric film 16 and thus the energy conversion efficiency of the FBAR can be maintained at a certain level.

Figure 4:
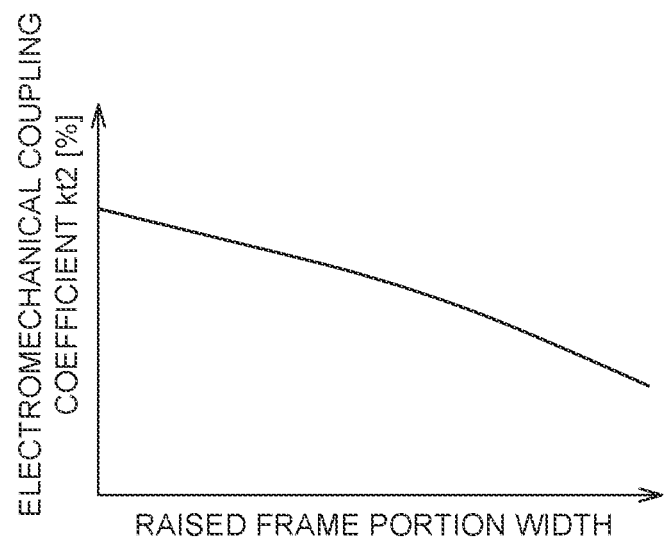
FIG. 4 is a graph showing a relationship between a width of a raised frame portion and an electromechanical coupling coefficient of the FBAR.

FIG. 4 is a graph showing a relationship between a width of the raised frame portion 17b and an electromechanical coupling coefficient kt2 of the FBAR. According to this graph, the electromechanical coupling coefficient kt2 of the FBAR can be a monotonically decreasing function of the width of the raised frame portion 17b. In other words, the electromechanical coupling coefficient kt2 becomes gradually smaller as the width of the raised frame portion 17b formed on the top electrode layer 17 of the FBAR becomes greater. According to this embodiment, the raised frame portion 17b of the first parallel FBAR $R_{P1}$ is wider than the raised frame portion 17b of the first series FBAR $R_{S1}$. As clearly shown in FIGS. 2C and 3C, the width of the region in the piezoelectric film 16 corresponding to the raised frame portion 17b of the first parallel FBAR $R_{P1}$ where the propagation velocity is lower is also greater than the width of the region in the piezoelectric film 16 corresponding to the raised frame portion 17b of the first series FBAR $R_{S1}$ where the propagation velocity is lower. This configuration according to the embodiment can ensure that the electromechanical coupling coefficient kt2 of the first parallel FBAR $R_{P1}$ is smaller than the electromechanical coupling coefficient kt2 of the first series FBAR $R_{S1}$.

Figure 5:
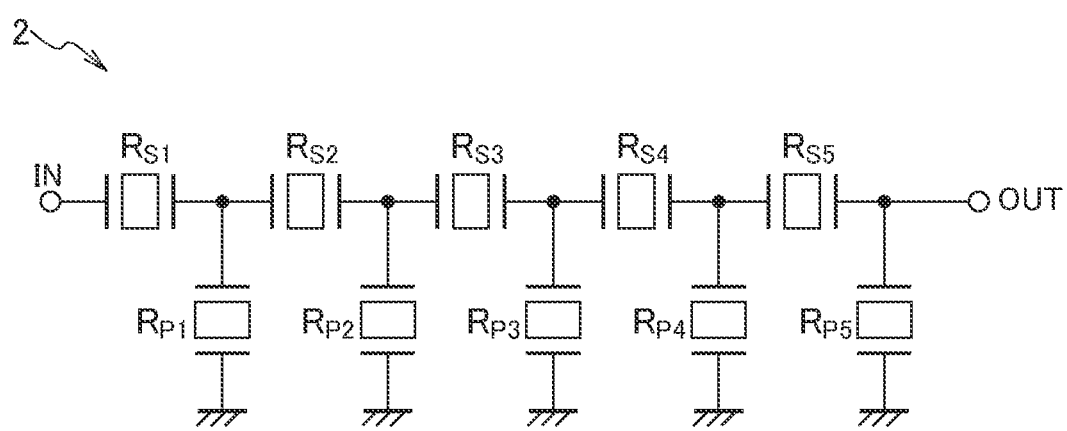
FIG. 5 is a circuit diagram of an example film bulk acoustic wave filter according to an embodiment.

FIG. 5 is a circuit diagram of a film bulk acoustic wave filter 2 according to an embodiment. The film bulk acoustic wave filter 2 of this embodiment includes five series FBARs, i.e., first to fifth series FBARs $R_{S1}$ to $R_{S5}$, disposed at respective five series arms extending from an input node IN to an output node OUT. The film bulk acoustic wave filter 2 further includes five parallel FBARs, i.e., first to fifth parallel FBAs $R_{P1}$ to $R_{P5}$, disposed at respective five parallel arms, which connect respective output nodes of the first to fifth series FBARs $R_{S1}$ to $R_{S5}$ with ground. The film bulk acoustic wave filter 2 forms a radio frequency filter in which the first to fifth series FBARs $R_{S1}$ to $R_{S5}$ and the first to fifth parallel FBARs $R_{P1}$ to $R_{P5}$ are connected in a ladder form.

Figure 6:
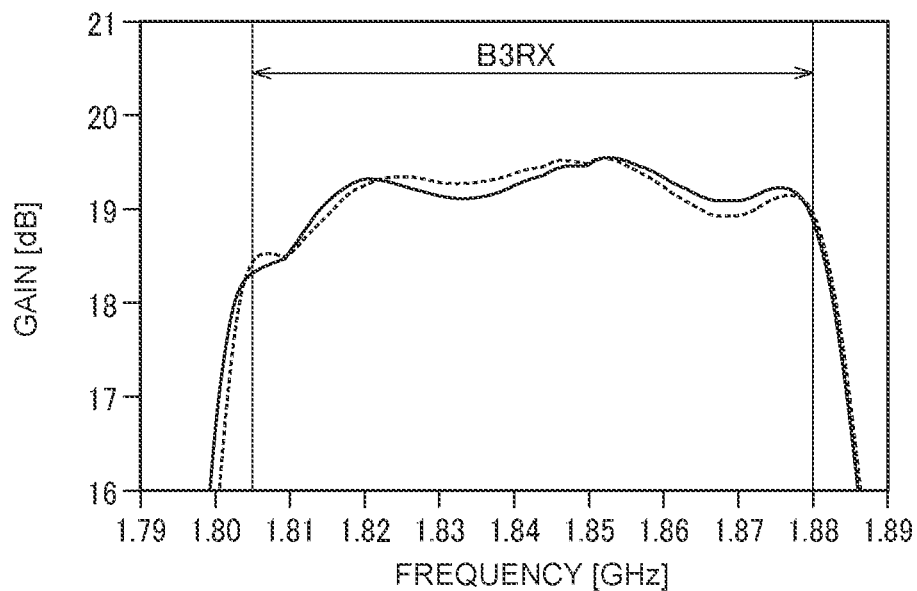
FIG. 6 is a graph showing an example of gain versus frequency characteristic for a film bulk acoustic wave filter according to an embodiment.

FIG. 6 is a graph showing an example of gain versus frequency characteristic for a film bulk acoustic wave filter according to the embodiment. In this example, the film bulk acoustic wave filter is configured as a band pass filter for a B3Rx frequency pass band. The film bulk acoustic wave filter can be formed, for example, by the film bulk acoustic wave filter 2 including the first to fifth series FBARs $R_{S1}$ to $R_{S5}$ and the first to fifth parallel FBARs $R_{P1}$ to $R_{P5}$ shown in FIG. 5. In the graph of FIG. 6, the solid line indicates a gain versus frequency characteristic of the film bulk acoustic wave filter according to the embodiment, whereas the dashed line indicates a gain versus frequency characteristic of a film bulk acoustic wave filter according to the prior art for comparison. As shown in the graph, the gain is maintained substantially constant within the B3Rx frequency pass band but sharply decreases out of the B3Rx frequency pass band and within the stop band by the embodiment and the prior art both.

Figure 7:
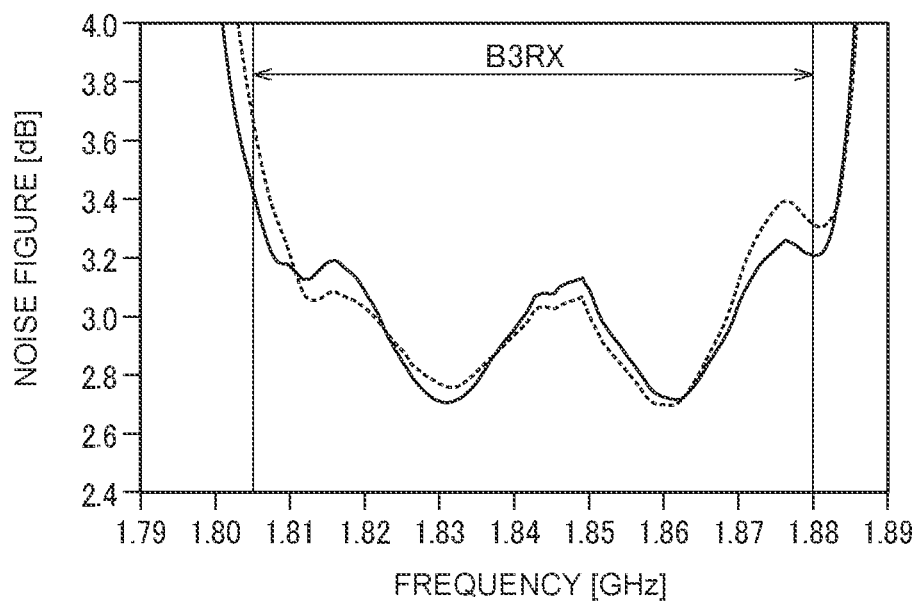
FIG. 7 is a graph showing an example of noise figure versus frequency characteristic for a film bulk acoustic wave filter according to an embodiment.

FIG. 7 is a graph showing an example of noise figure versus frequency characteristic for a film bulk acoustic wave filter according to the embodiment. This example is obtained by the film bulk acoustic wave filter of the embodiment having the B3Rx frequency pass band indicated in the gain versus frequency characteristic shown in FIG. 6. In the graph of FIG. 7, the solid line indicates a noise figure versus frequency characteristic of the film bulk acoustic wave filter according to the embodiment, whereas the dashed line indicates a noise figure versus frequency characteristic of a film bulk acoustic wave filter according to the prior art for comparison. It should be appreciated that the film bulk acoustic wave filter according to the prior art in this example also has the gain versus frequency characteristic of the prior art shown in FIG. 6. As indicated by the dashed line in the graph, the noise figure is significantly greater around the upper limit and the lower limit of the B3Rx frequency pass band by the film bulk acoustic wave filter according to the prior art. In contrast, as indicated by the solid line, the noise figure is significantly reduced around the upper limit and the lower limit of the B3Rx frequency pass band by the film bulk acoustic wave filter of the embodiment. The values significantly greater around the upper limit and the lower limit of the B3Rx frequency pass band contribute to the noise figure in the B3Rx frequency pass band. The film bulk acoustic wave filter of the embodiment allows the noise figure to be significantly reduced around the upper limit and the lower limit of the B3Rx frequency pass band and thus also allows the noise figure to be significantly reduced for the entire B3Rx frequency pass band.

In the film bulk acoustic wave filter of the embodiment, the electromechanical coupling coefficient of the first parallel FBAR $R_{P1}$ disposed at the parallel arm closest to the input node IN is smaller than the electromechanical coupling coefficient of the first series FBAR $R_{S1}$ disposed at the series arm closest to the input node IN such that the noise generation can be reduced. As set forth above, reducing the noise figures around the upper limit and the lower limit of the pass band that contribute to the noise figure of the pass band causes reducing the noise figure of the entire pass band. The film bulk acoustic wave filter of the embodiment that can reduce the noise figure in such a way can be advantageous for communication devices such as mobile phones in which noise generation should be suppressed.

Figure 8A:
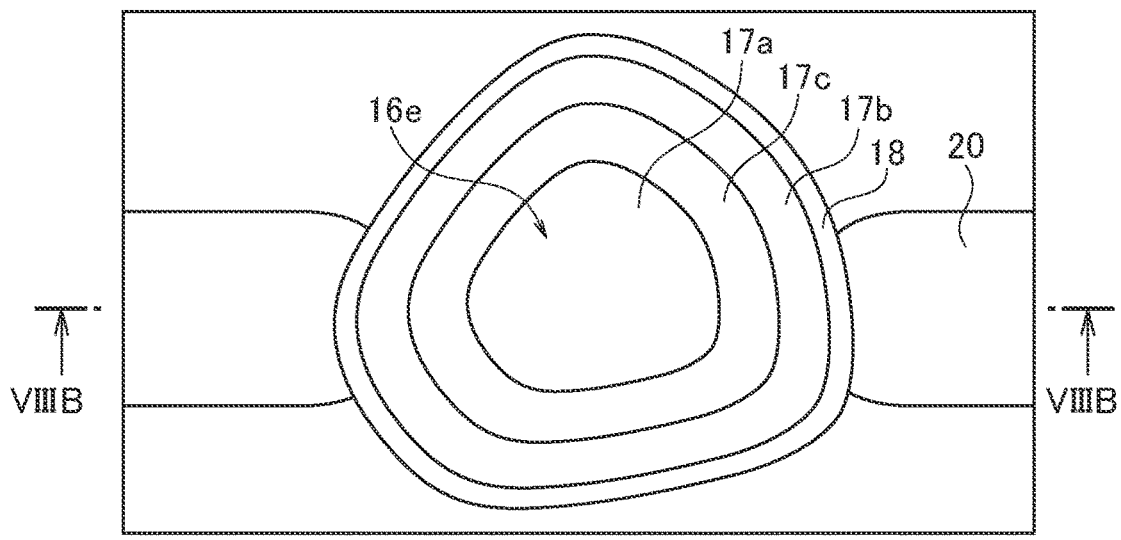
FIG. 8A is a top view of an alternative example FBAR forming a film bulk acoustic wave filter according to an embodiment.
Figure 8B:
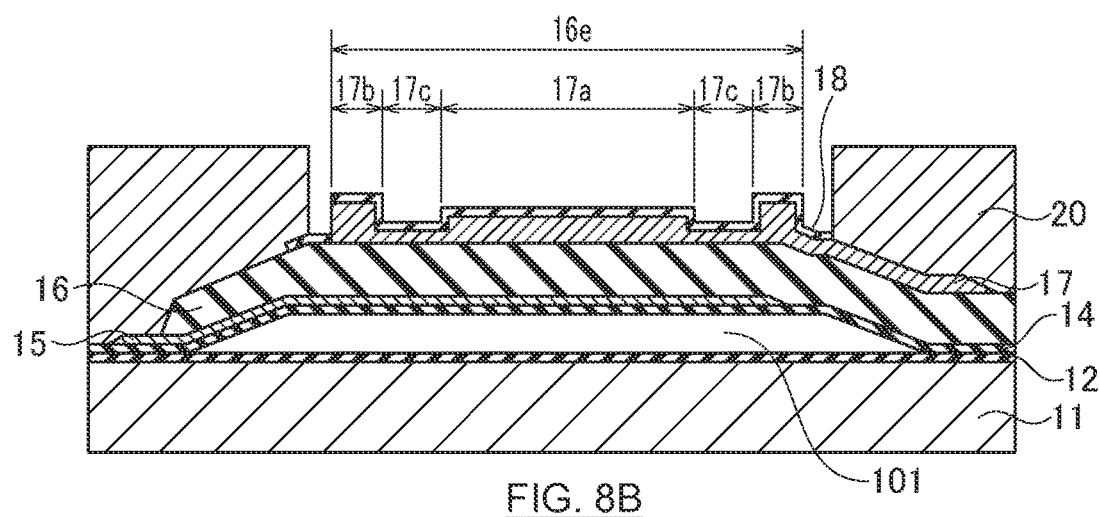
FIG. 8B is a cross-sectional view of the FBAR of FIG. 8A taken along the lines VIIIB-VIIIB.

FIG. 8A is a top view of an alternative example FBAR forming the film bulk acoustic wave filter 1 of an embodiment and FIG. 8B is a cross-sectional view of the alternative example FBAR. The cross-sectional view of FIG. 8B shows a cross-section taken along the lines VIIIB-VIIIB in the top view of FIG. 8A. The alternative example FBAR shown in FIGS. 8A and 8B can be used as an FBAR forming the film bulk acoustic wave filter according to an embodiment as discussed above. The alternative example FBAR is similar to the first series FBAR $R_{S1}$ shown in FIGS. 2A and 2B or the first parallel FBAR $R_{P1}$ shown in FIGS. 3A and 3B as a typical FBAR, except for the structure of the top electrode layer 17. In FIGS. 8A and 8B, like reference numerals are used to indicate identical components shown in FIGS. 2A and 2B or FIGS. 3A and 3B to clarify the correspondence relationships.

Although the substrate 11 in this FBAR is assumed to be formed from silicon, the substrate 11 can be formed from aluminum nitride, silicon nitride, magnesium oxide spinel, magnesium oxide crystal, sapphire, and the like. A top surface of the substrate 11 can be a main surface of the substrate 11. The main surface can be covered with a first passivation layer 12, for example, a silicon oxide layer. A piezoelectric film 16 is formed over a region of the main surface as a dome structure that is raised and defines a cavity 101 at a certain height from the main surface. The piezoelectric film 16 can be formed from a piezoelectric material such as aluminum nitride (AlN), zinc oxide (ZnO), and the like. The piezoelectric film 16 can be doped with an additive such as scandium (Sc). The piezoelectric film 16 has a bottom surface, on which a bottom electrode layer 15 is formed to extend from a periphery of the piezoelectric film 16 to an active region of the piezoelectric film 16 that can oscillate. The bottom surface of the piezoelectric film 16 can be covered with a second passivation layer 14, for example, a silicon oxide layer. The second passivation layer 14 can also cover the bottom electrode layer 15. A top electrode layer 17 is disposed on a top surface of the active region 16e of the piezoelectric film 16 to oppose the bottom electrode layer 15. A wiring layer 20 is disposed on the top surface of the piezoelectric film 16 to be connected to the bottom electrode layer 15 and the top electrode layer 17. A periphery of the top surface of the piezoelectric film 16 along which the wiring layer 20 is not formed can be covered with a third passivation layer 18, for example, a silicon nitride layer. The bottom electrode layer 15 and the top electrode layer 17 are configured to apply a voltage to the piezoelectric film 16 and excite the piezoelectric film 16 and also to extract a voltage generated by the piezoelectric film 16. The bottom electrode layer 15 and the top electrode layer 17 can be formed from a metal such as copper. The wiring layer 20 can be formed from a metal such as copper or titanium.

The active region 16e of the piezoelectric film 16 is a region that can oscillate by being supported by a circumference of the piezoelectric film 16 that is connected to the main surface of the substrate 11. The active region 16e can be caused to oscillate in a direction normal to the main surface of the substrate 11 by a voltage applied across the bottom electrode layer 15 and the top electrode layer 16. The active region 16e can substantially correspond to a portion opposing the main surface of the substrate 11 via the cavity 101. As shown in FIG. 8A, the active region 16e is formed to have a distorted shape the surrounding contour of which is asymmetric in plan view such that a stationary wave cannot be generated by the oscillation. It is to be understood that the contour shape of the piezoelectric film 16 shown in FIG. 8A is for illustrative purpose only and thus is not necessarily limited to this shape. The top electrode layer 17 can include a planar portion 17a, a raised frame portion 17b, and a recessed frame portion 17c. The planar portion 17a is formed to have a certain height from the top surface of the piezoelectric film 16 mainly for covering the active region 16e. The raised frame portion 17b is formed to extend along a periphery of the piezoelectric film 16 having a top surface raised at a certain height from the planar portion 17a across a certain width. The recessed frame portion 17c is formed to extend along a periphery inside of and adjacent to the raised frame portion 17b having a top surface recessed at a certain depth from the planar portion 17a.

Figure 8C:
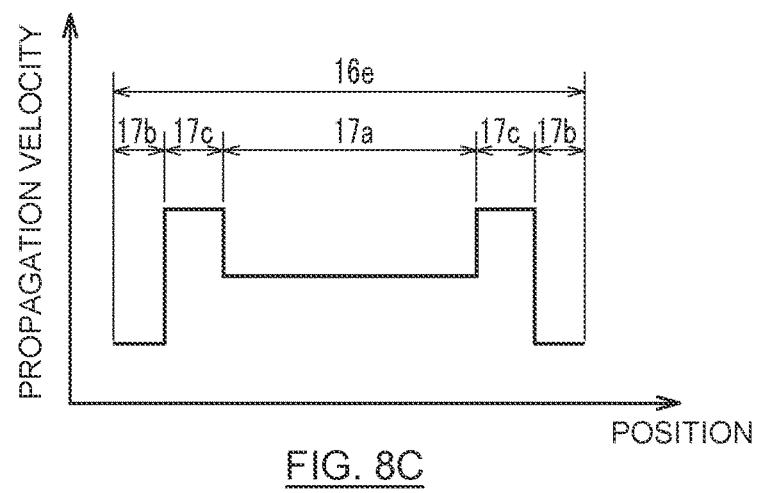
FIG. 8C is a graph showing a propagation velocity distribution of an oscillation on a piezoelectric film of the FBAR of FIGS. 3A and 3B.

FIG. 8C is a graph showing a propagation velocity or acoustic velocity of the oscillation as a function of a horizontal position across the plane of the piezoelectric film 16 of the FBAR shown in FIGS. 8A and 8B. The positional region 16e and sequential positional regions 17b, 17c, 17a, 17c, and 17b shown in FIG. 8C correspond to the positional region 16e and sequential positional regions 17b, 17c, 17a, 17c, and 17b shown in FIG. 8B, respectively. As shown in FIG. 8C, across the active region 16e of the piezoelectric film 16, the propagation velocity of the oscillation generated by the piezoelectric film 16 in the region where the raised frame portion 17b is formed is lower than a constant propagation velocity in the region where the planar portion 17a is formed, whereas the propagation velocity of the oscillation generated by the piezoelectric film 16 in the region where the recessed frame portion 17c is formed is higher than the constant propagation velocity in the region where the planar portion 17a is formed. The propagation velocity of the oscillation generated by the piezoelectric film 16 is maintained lower in the raised frame portion 17b surrounding the planar portion 17a, and accordingly, the oscillation energy of the piezoelectric film 16 can be confined within the planar portion 17a. This confinement can suppress a dissipation of the oscillation energy of the piezoelectric film 16 and thus the energy conversion efficiency of the FBAR can be maintained at a certain level.

According to this alternative example FBAR, the electromechanical coupling coefficient kt2 of the FBAR can also be a monotonically decreasing function of the width of the raised frame portion 17b as shown in FIG. 4. Accordingly, even if the first parallel FBAR $R_{P1}$ and the first series FBAR $R_{S1}$ of the film bulk acoustic wave filter 1 are formed by the alternative example FBAR shown in FIGS. 8A and 8B, configuring the width of the raised frame portion 17b of the first parallel FBAR $R_{P1}$ to be less than the width of the raised frame portion 17b of the first series FBAR $R_{S1}$ can allow the electromechanical coupling coefficient kt2 of the first parallel FBAR $R_{P1}$ to be smaller than the electromechanical coupling coefficient kt2 of the first series FBAR $R_{S1}$, similar to the film bulk acoustic wave filter 1.

Figure 9:
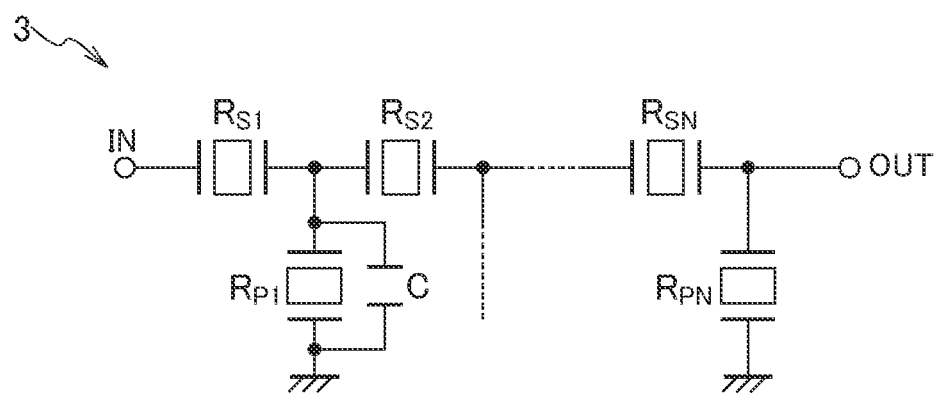
FIG. 9 is a circuit diagram of a comparative example film bulk acoustic wave filter.

FIG. 9 is a circuit diagram of a comparative example film bulk acoustic wave filter. In the film bulk acoustic wave filter 1 according to the embodiment, the width of the raised frame portion 17b of the first parallel FBAR $R_{P1}$ shown in FIGS. 3A and 3B is less than the width of the raised frame portion 17b of the first series FBAR $R_{S1}$ shown in FIGS. 2A and 2B such that the electromechanical coupling coefficient of the first parallel FBAR $R_{P1}$ disposed at the parallel arm closest to the input node IN can be smaller than the electromechanical coupling coefficient of the first series FBAR $R_{S1}$ disposed at the series arm closest to the input node IN. However, in the conventional film bulk acoustic wave filter 3 of the comparative example as shown in FIG. 9, a capacitor C is coupled to the first parallel FBAR $R_{P1}$ in parallel such that the electromechanical coupling coefficient for the first parallel FBAR $R_{P1}$ and the capacitor C as a whole can be smaller than the electromechanical coupling coefficient of the first series FBAR $R_{S1}$. According to such a comparative example, for implementing the capacitor C coupled to the first parallel FBAR $R_{P1}$ in parallel, an area depending on the capacity of the capacitor C is required on the main surface of the substrate 11. Thus, downsizing or densifying such a conventional film bulk acoustic wave filter has been difficult.

Film Bulk Acoustic Wave Filter Assemblies

Figure 10:
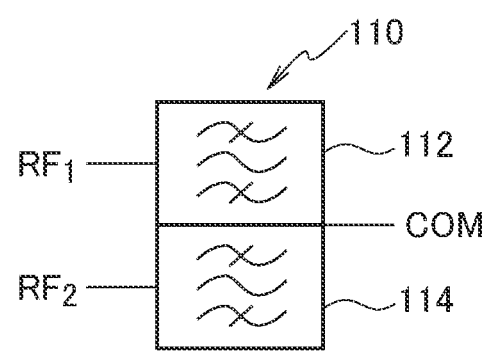
FIG. 10 is a schematic diagram of a duplexer according to an embodiment.

FIG. 10 is a schematic diagram of a duplexer 110 including a film bulk acoustic wave filter according to an embodiment. The duplexer 110 includes a first filter 112 and a second filter 114 coupled together at a common node COM. One of the filters in the duplexer 110 can be a transmit filter and the other of the filters in the duplexer 110 can be a receive filter. The transmit and receive filters may be configured as respective ladder filters each including a topology similar to the ladder filter shown in FIG. 1. In some other instances, such as in a diversity receive application, the duplexer 110 can include two receive filters. The common node COM can be an antenna node.

The first filter 112 is a film bulk acoustic wave filter configured to filter a radio frequency signal. The first filter 112 may include FBARs coupled between a first radio frequency node $RF_1$ and the common node COM. The first radio frequency node $RF_1$ can be a transmit node or a receive node. The first filter 112 includes one or more FBARs implemented in accordance with any suitable principles and advantages disclosed herein.

The second filter 114 can be any suitable filter configured to filter a second radio frequency signal. The second filter 114 can be, for example, an acoustic wave filter, an acoustic wave filter that includes one or more FBARs implemented in accordance with any suitable principles and advantages disclosed herein, an LC filter, a hybrid acoustic wave LC filter, or the like. The second filter 114 is coupled between a second radio frequency node $RF_2$ and the common node COM. The second radio frequency node $RF_2$ can be a transmit node or a receive node.

Although example embodiments may be discussed with filters or duplexers for illustrative purposes, any suitable principles and advantages disclosed herein can be implemented in a multiplexer that includes a plurality of filters coupled together at a common node. Examples of multiplexers include but are not limited to a duplexer with two filters coupled together at a common node, a triplexer with three filters coupled together at a common node, a quadplexer with four filters coupled together at a common node, a hexaplexer with six filters coupled together at a common node, an octoplexer with eight filters coupled together at a common node, or the like. One or more filters of a multiplexer can include one or more FBARs implemented in accordance with any suitable principles and advantages disclosed herein.

Figure 11:
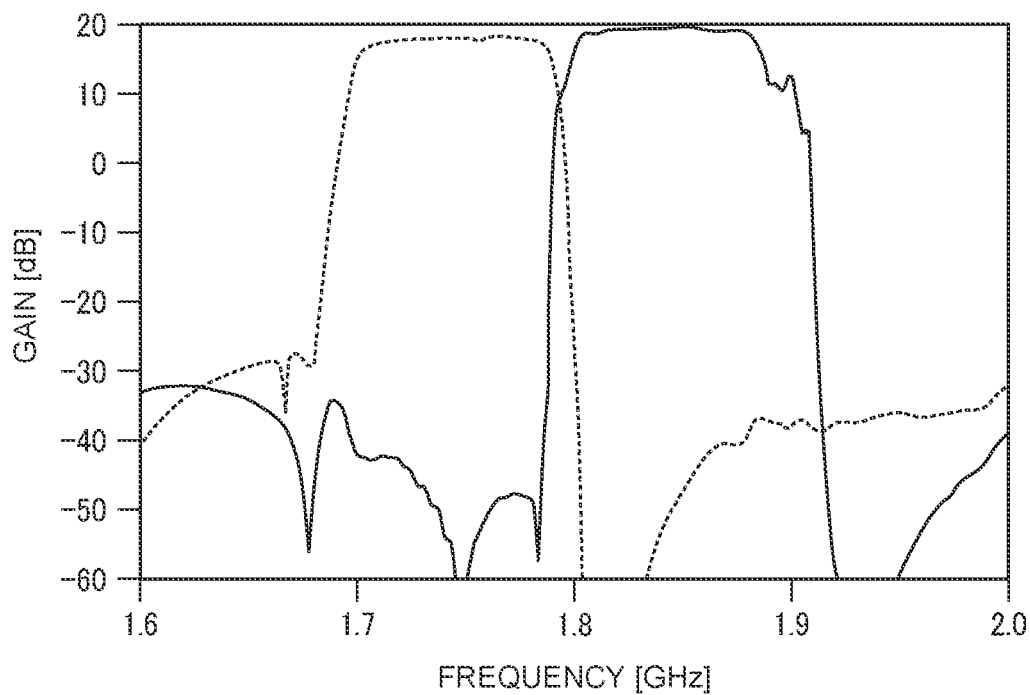
FIG. 11 is a graph showing an example of gain versus frequency characteristic for a duplexer according to an embodiment.

FIG. 11 is a graph showing an example of gain versus frequency characteristic for the duplexer 110. In this example, film bulk acoustic wave filters according to the embodiments are used for the first filter 112 to filter a first radio frequency signal and the second filter 114 to filter a second radio frequency signal. In the graph, the dashed line indicates the gain versus frequency characteristic of the first filter 112 and the solid line indicates the gain versus frequency characteristic of the second filter 114. Each of the first filter 112 and the second filter 114 can be formed by the film bulk acoustic wave filter 2 including the first series FBAR $R_{S1}$ to fifth series FBAR $R_{S5}$ and the first parallel FBAR $R_{P1}$ to fifth parallel FBAR $R_{P5}$ shown in FIG. 5. The film bulk acoustic wave filter of the embodiment allows the noise figure to be significantly reduced around the upper limit and the lower limit of the pass band and also allows the noise figure to be significantly reduced for the entire pass band. Thus, noise generation can be reduced in the duplexer 110 of this example.

Figure 12:
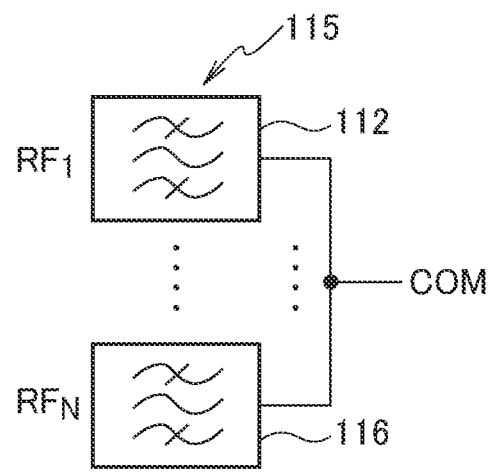
FIG. 12 is a schematic diagram of a multiplexer according to an embodiment.

FIG. 12 is a schematic diagram of a multiplexer 115 that includes a film bulk acoustic wave filter according to an embodiment. The multiplexer 115 includes a plurality of filters such as a first filter 112 and another filter 116 coupled together at a common node COM. The plurality of filters can include any suitable number of filters. For instance, the plurality of filters can include three filters, four filters, five filters, six filters, seven filters, eight filters, or more or fewer number of filters. Some or all of the plurality of filters can be acoustic wave filters. As illustrated, the filters 112 to 116 each have a fixed electrical connection to the common node COM. This can be referred to as hard multiplexing or fixed multiplexing. Filters have fixed electrical connections to the common node COM in hard multiplexing applications. Each of the filters 112 to 116 has a respective input/output node $RF_1$ to $RF_N$.

The first filter 112 is a film bulk acoustic wave filter configured to filter a radio frequency signal. The first radio frequency node $RF_1$ can be a transmit node or a receive node. The first filter 112 includes one or more FBARs implemented in accordance with any suitable principles and advantages disclosed herein. The other filter(s) of the multiplexer 115 can include one or more FBARs, one or more film bulk acoustic wave filters that include one or more FBARs implemented in accordance with any suitable principles and advantages disclosed herein, one or more LC filters, one or more hybrid acoustic wave LC filters, or any suitable combination thereof.

Figure 13:
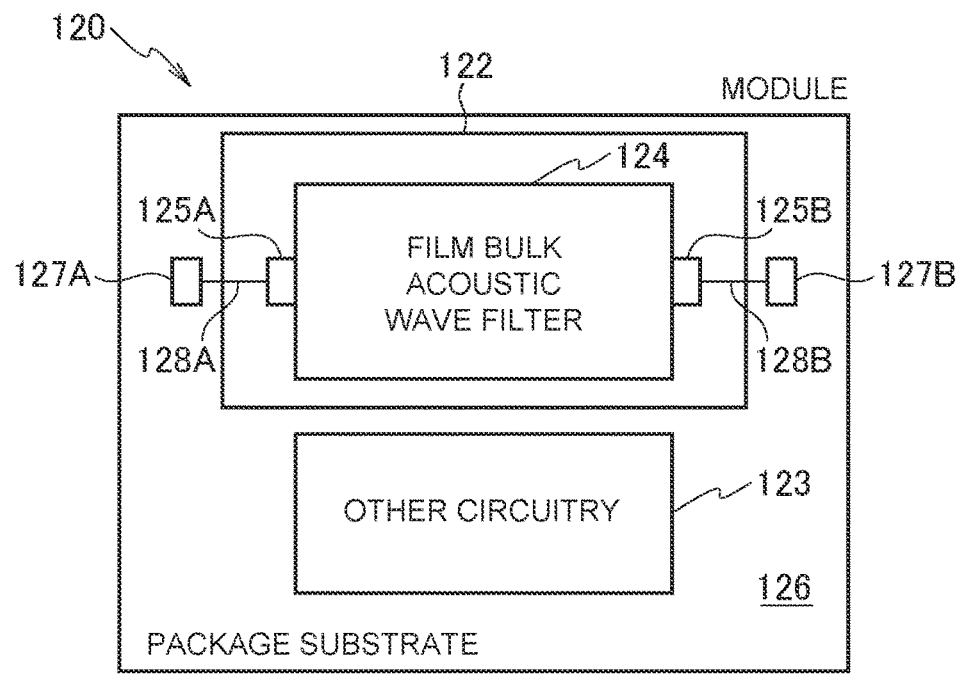
FIG. 13 is a schematic diagram of a radio frequency module according to an embodiment.
Figure 14:
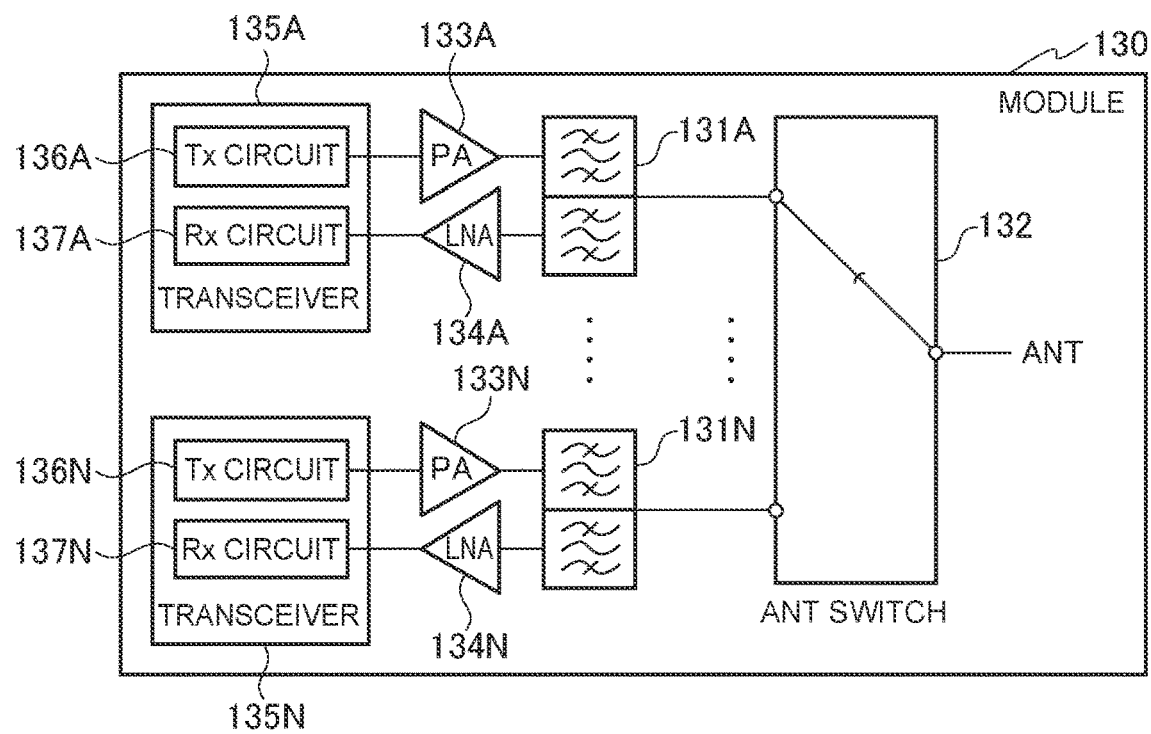
FIG. 14 is a schematic diagram of a radio frequency module according to an embodiment.
Figure 15:
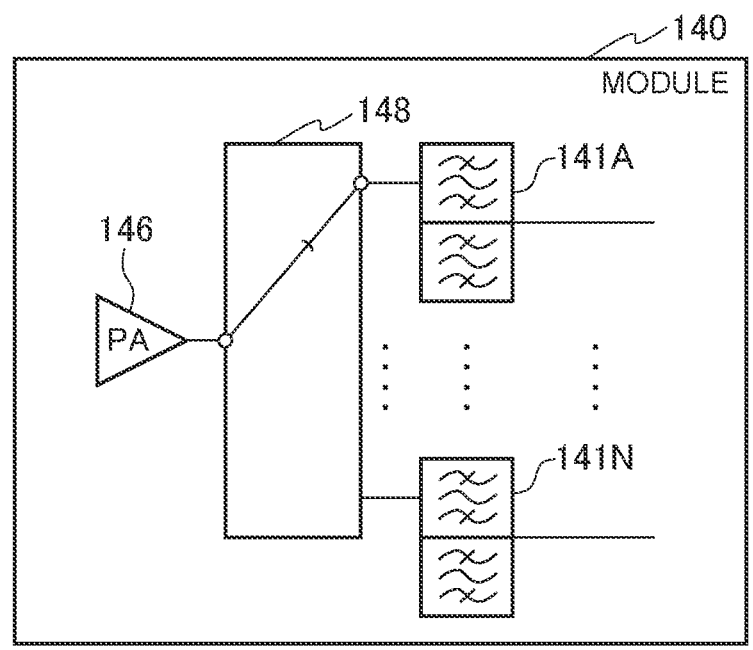
FIG. 15 is a schematic diagram of a radio frequency module according to an embodiment.

The acoustic wave filters and/or acoustic wave resonators discussed herein can be implemented in a variety of packaged modules. Some examples of packaged modules will now be discussed in which any suitable principles and advantages of the acoustic wave filters and/or acoustic wave resonators discussed herein can be implemented. Examples of packaged modules may include packages that enclose the illustrated circuit elements. A module including a radio frequency component may be referred to as a radio frequency module. The illustrated circuit elements can be disposed on a common packaging substrate. The packaging substrate can be a laminate substrate, for example. FIGS. 13 to 15 are schematic block diagrams of illustrative packaged modules according to certain embodiments. Any suitable combination of features of these packaged modules can be implemented with each other. While duplexers are illustrated in the example packaged modules of FIGS. 13 to 16, any other suitable multiplexer that includes a plurality of filters coupled to a common node can be implemented instead of one or more duplexers. For instance, a quadplexer can be implemented in certain applications. Alternatively or additionally, one or more filters of a packaged module can be configured as a transmit filter or a receive filter that is not included in a multiplexer.

FIG. 13 is a schematic diagram of a radio frequency module 120 that includes a film bulk acoustic wave component 122 according to an embodiment. The illustrated radio frequency module 120 includes the film bulk acoustic wave component 122 and other circuitry 123. The film bulk acoustic wave component 122 can include one or more film bulk acoustic wave filters in accordance with any suitable combination of features disclosed herein. The film bulk acoustic wave component 122 can include an FBAR die that includes FBARs, for example.

The film bulk acoustic wave component 122 shown in FIG. 13 includes one or more film bulk acoustic wave filters 124 and terminals 125A and 125B. The one or more film bulk acoustic wave filters 124 includes one or more FBARs implemented in accordance with any suitable principles and advantages disclosed herein. The terminals 125A and 125B can serve, for example, as an input contact and an output contact. Although two terminals are illustrated, any suitable number of terminals can be implemented for a particular application. The film bulk acoustic wave component 122 and the other circuitry 123 are on the same package substrate 126 in FIG. 13. The packaging substrate 126 can be a laminate substrate. The terminals 125A and 125B can be electrically connected to contacts 127A and 127B, respectively, on the package substrate 126 by way of electrical connectors 128A and 128B, respectively. The electrical connectors 128A and 128B can be bumps or wire bonds, for example.

The other circuitry 123 can include any suitable additional circuitry. For example, the other circuitry can include one or more power amplifiers, one or more radio frequency switches, one or more additional filters, one or more low noise amplifiers, one or more RF couplers, one or more delay lines, one or more phase shifters, the like, or any suitable combination thereof. The other circuitry 123 can be electrically connected to the one or more film bulk acoustic wave filters 124. The radio frequency module 120 can include one or more packaging structures to, for example, provide protection and/or facilitate easier handling of the radio frequency module 120. Such a packaging structure can include an overmold structure formed over the packaging substrate 126. The overmold structure can encapsulate some or all of the components of the radio frequency module 120.

FIG. 14 is a schematic block diagram of a radio frequency module 130 that includes duplexers 131A to 131N and an antenna switch 132. One or more filters of the duplexers 131A to 131N can include two or more acoustic wave resonators having resonant frequencies in accordance with any suitable principles and advantages disclosed herein. Any suitable number of duplexers 131A to 131N can be implemented. The duplexers 131A to 131N correspond to transceivers 135A to 135N, respectively, and are coupled to respective transmit circuits 136A to 136N and receive circuits 137A to 137B of the transceivers 135A to 135N via respective power amplifiers (PAs) 133A to 133N and low noise amplifiers (LNAs) 134A to 134N. The antenna switch 132 can have a number of throws corresponding to the number of duplexers 131A to 131N. The antenna switch 132 can include one or more additional throws coupled to one or more filters external to the radio frequency module 130 and/or coupled to other circuitry. The antenna switch 132 can electrically couple a selected duplexer to an antenna port of the radio frequency module 130.

FIG. 15 is a schematic block diagram of a radio frequency module 140 that includes a power amplifier 146, a radio frequency switch 148, and duplexers 141A to 141N according to an embodiment. The power amplifier 146 can amplify a radio frequency signal. The radio frequency switch 148 can be a multi-throw radio frequency switch. The radio frequency switch 148 can electrically couple an output of the power amplifier 146 to a selected transmit filter of the duplexers 141A to 141N. One or more filters of the duplexers 141A to 141N can include any suitable number of acoustic wave resonators implemented in accordance with any suitable principles and advantages disclosed herein. Any suitable number of duplexers 141A to 141N can be implemented.

Figure 16:
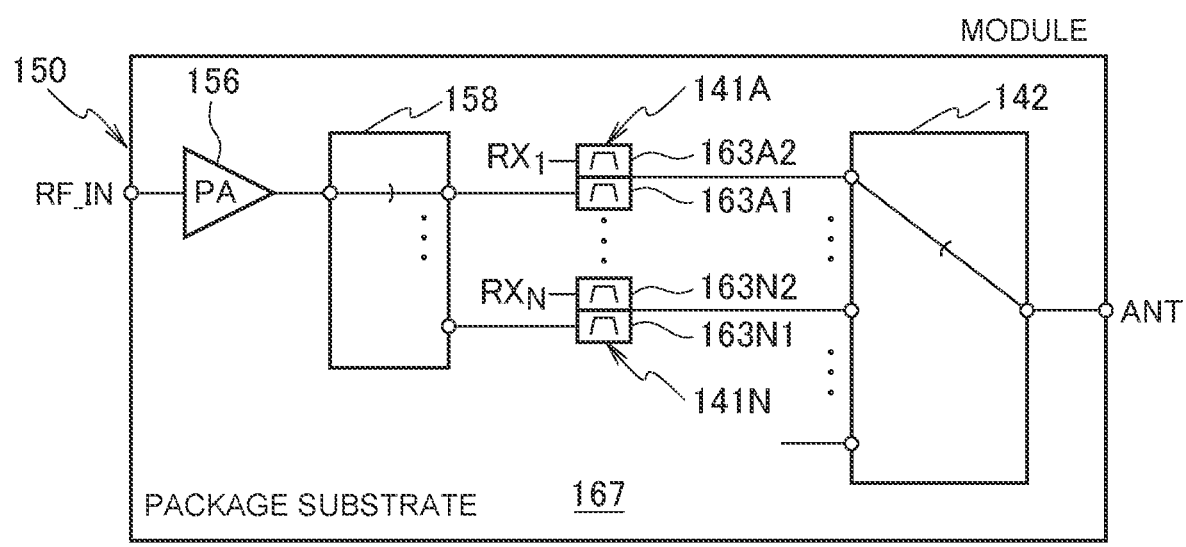
FIG. 16 is a schematic diagram of a radio frequency module according to an embodiment.

FIG. 16 is a schematic diagram of a radio frequency module 150 that includes a film bulk acoustic wave filter according to an embodiment. As illustrated, the radio frequency module 150 includes duplexers 141A to 141N that include respective transmit filters 163A1 to 163N1 and respective receive filters 163A2 to 163N2, a power amplifier 156, a select switch 158, and an antenna switch 142. The radio frequency module 150 can include a package that encloses the illustrated elements. The illustrated elements can be disposed on the same package substrate 167. The packaging substrate 167 can be a laminate substrate, for example. The radio frequency module 150 that includes a power amplifier 156 can be referred to as a power amplifier module. The radio frequency module 150 can include a subset of the elements illustrated in FIG. 16 and/or additional elements. The radio frequency module 150 may include at least one acoustic wave device implemented in accordance with any suitable principles and advantages disclosed herein.

The duplexers 141A to 141N can each include two film bulk acoustic wave filters coupled to a common node. For example, the two film bulk acoustic wave filters can be a transmit filter and a receive filter. As illustrated, transmit filters 163A1 to 163N1 and receive filters 163A2 to 163N2 can each include a band pass filter configured to filter a radio frequency signal. One or more of the transmit filters 163A1 to 163N1 can include an acoustic wave resonator implemented in accordance with any suitable principles and advantages disclosed herein. One or more of the receive filters 163A2 to 163N2 can include an acoustic wave resonator implemented in accordance with any suitable principles and advantages disclosed herein. Although FIG. 16 illustrates duplexers, any suitable principles and advantages disclosed herein can be implemented in other multiplexers (e.g., quadplexers, hexaplexers, octoplexers, etc.) and/or in switch-plexers.

The power amplifier 156 can amplify a radio frequency signal. The illustrated switch 158 is a multi-throw radio frequency switch. The switch 158 can electrically connect the output of the power coupling 156 to a selected transmit filter of the transmit filters 163A1 to 163N1. In some instances, the switch 158 can electrically connect the output of the power amplifier 156 to more than one of the transmit filters 163A1 to 163N1. The antenna switch 142 can selectively couple a signal from one or more of the duplexers 141A to 141N to an antenna port ANT. The duplexers 141A to 141N can be associated with different frequency bands and/or different modes of operation (e.g., different power modes, different signaling modes, etc.).

Wireless Communication Devices

Figure 17A:
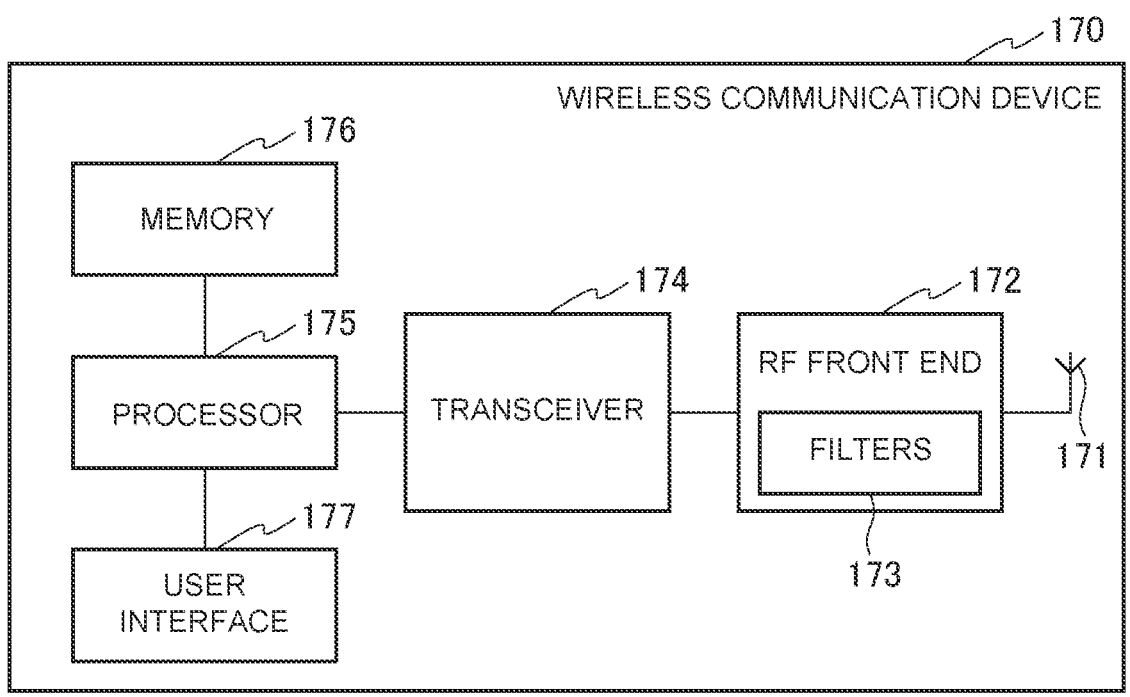
FIG. 17A is a schematic diagram of a wireless communication device according to an embodiment.

The filters including FBARs disclosed herein can be implemented in a variety of wireless communication devices. FIG. 17A is a schematic diagram of a wireless communication device 170 that includes filters 173 in a radio frequency (RF) front end 172 according to an embodiment. One or more of the filters 173 can include an acoustic wave resonator implemented in accordance with any suitable principles and advantages disclosed herein. The wireless communication device 170 can be any suitable wireless communication device. For instance, a wireless communication device 170 can be a mobile phone such as a smart phone. As illustrated, the wireless communication device 170 includes an antenna 171, an RF front end 172, a transceiver 174, a processor 175, a memory 176, and a user interface 177. The antenna 171 can transmit RF signals provided by the RF front end 172. Such RF signals can include carrier aggregation signals. The antenna 171 can receive RF signals and provide the received RF signals to the RF front end 172 for processing. Such RF signals can include carrier aggregation signals. The wireless communication device 170 can include two or more antennas in certain instances.

The RF front end 172 can include one or more power amplifiers, one or more low noise amplifiers, one or more RF switches, one or more receive filters, one or more transmit filters, one or more duplex filters, one or more multiplexers, one or more frequency multiplexing circuits, the like, or any suitable combination thereof. The RF front end 172 can transmit and receive RF signals associated with any suitable communication standards. One or more of the filters 173 can include an acoustic wave resonator that includes any suitable combination of features of the embodiments disclosed above.

The transceiver 174 can provide RF signals to the RF front end 172 for amplification and/or other processing. The transceiver 174 can also process an RF signal provided by a low noise amplifier of the RF front end 172. The transceiver 174 is in communication with the processor 175. The processor 175 can be a baseband processor. The processor 175 can provide any suitable baseband processing functions for the wireless communication device 170. The memory 176 can be accessed by the processor 175. The memory 176 can store any suitable data for the wireless communication device 170. The user interface 177 can be any suitable user interface, such as a display with touch screen capabilities.

Figure 17B:
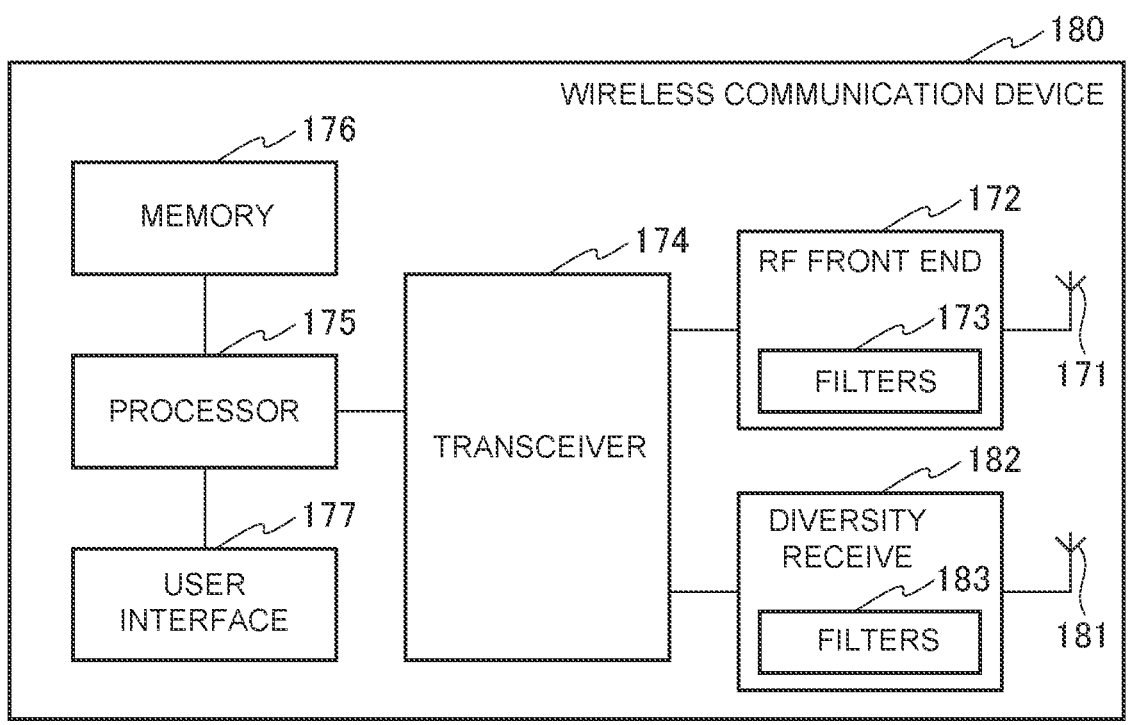
FIG. 17B is a schematic diagram of a wireless communication device according to an embodiment.

FIG. 17B is a schematic diagram of a wireless communication device 180 that includes filters 173 in a radio frequency front end 172 and second filters 183 in a diversity receive module 182. The wireless communication device 180 is like the wireless communication device 170 of FIG. 17A, except that the wireless communication device 180 also includes diversity receive features. As illustrated in FIG. 17B, the wireless communication device 180 includes a diversity antenna 181, a diversity module 182 configured to process signals received by the diversity antenna 181 and including the second filters 183, and a transceiver 174 in communication with both the radio frequency front end 172 and the diversity receive module 182. One or more of the second filters 183 can include an acoustic wave resonator implemented in accordance with any suitable principles and advantages disclosed herein.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes example embodiments, the teachings described herein can be applied to a variety of structures. Any of the principles and advantages discussed herein can be implemented in association with RF circuits configured to process signals having a frequency in a range from about 30 kHz to 300 GHz, such as in a frequency range from about 450 MHz to 8.5 GHz. Acoustic wave filters disclosed herein can filter RF signals at frequencies up to and including millimeter wave frequencies.

Aspects of this disclosure can be implemented in various electronic devices. Examples of the electronic devices can include, but are not limited to, consumer electronic products, parts of the consumer electronic products such as packaged radio frequency modules, radio frequency filter die, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a robot such as an industrial robot, an Internet of things device, a stereo system, a digital music player, a radio, a camera such as a digital camera, a portable memory chip, a home appliance such as a washer or a dryer, a peripheral device, a wrist watch, a clock, etc. Further, the electronic devices can include unfinished products.

Unless the context indicates otherwise, throughout the description and the claims, the words "comprise," "comprising," "include," "including" and the like are to generally be construed in an inclusive sense, as opposed to an exclusive or exhaustive sense; that is to say, in the sense of "including, but not limited to." Conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. The word "coupled," as generally used herein, refers to two or more elements that may be either directly connected, or connected by way of one or more intermediate elements. Likewise, the word "connected," as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively.

While certain embodiments have been described, these embodiments have been presented by way of example only, and are not intended to limit the scope of the disclosure. Indeed, the novel resonators, filters, multiplexers, devices, modules, wireless communication devices, apparatus, methods, and systems described herein may be embodied in a variety of other forms. Furthermore, various omissions, substitutions and changes in the form of the resonators, filters, multiplexers, devices, modules, wireless communication devices, apparatus, methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A ladder type acoustic wave filter, the acoustic wave filter comprising:
   a plurality of parallel arm resonators; and
   a plurality of series arm resonators, an electromechanical coupling coefficient of a parallel arm resonator closest to an input node of the acoustic wave filter among the plurality of parallel arm resonators being smaller than an electromechanical coupling coefficient of a series arm resonator closest to the input node of the acoustic wave filter among the plurality of series arm resonators, the plurality of parallel arm resonators and the plurality of series arm resonators being formed from film bulk acoustic wave resonators, each of the film bulk acoustic wave resonators including a substrate, a piezoelectric film supported over the substrate and over a cavity defined between the piezoelectric film and the substrate, and an electrode layer disposed on a surface of the piezoelectric film, the film bulk acoustic wave resonator of the parallel arm resonator closest to the input node including a first low propagation velocity region extending along a periphery of an active region of the piezoelectric film that can oscillate, and the film bulk acoustic wave resonator of the series arm resonator closest to the input node including a second low propagation velocity region extending along a periphery of an active region of the piezoelectric film that can oscillate, a width of the first low propagation velocity region being greater than a width of the second low propagation velocity region.

2. The acoustic wave filter of claim 1 wherein an electromechanical coupling coefficient of each of the film bulk acoustic wave resonators is a decreasing function of the width of the low propagation region in the respective film bulk acoustic wave resonator.

3. The acoustic wave filter of claim 1 wherein the parallel arm resonator closest to the input node includes a first raised frame portion extending along the periphery of the active region of the piezoelectric film that can oscillate, the first raised frame portion being formed by a portion of the electrode layer disposed on a top surface of the piezoelectric film, and the series arm resonator closest to the input node includes a second raised frame portion extending along the periphery of the active region of the piezoelectric film that can oscillate, in which the second raised frame portion is formed by a portion of the electrode layer disposed on a top surface of the piezoelectric film, a region of the piezoelectric film in which the first raised frame portion is formed and a region of the piezoelectric film in which the second raised frame portion is formed corresponding to the first low propagation velocity region and the second low propagation velocity region, respectively.

4. The acoustic wave filter of claim 3 wherein a width of the first raised frame portion is greater than a width of the second raised frame portion.

5. The acoustic wave filter of claim 3 wherein an electromechanical coupling coefficient of each of the film bulk acoustic wave resonators is a decreasing function of the width of the raised frame portion in the respective film bulk acoustic wave resonator.

6. The acoustic wave filter of claim 3 wherein each of the parallel arm resonator closest to the input node and the series arm resonator closest to the input node includes a recessed frame portion of the electrode layer, the recessed frame portion being adjacent to an inside of the raised frame portion of the electrode layer disposed on the top surface of the piezoelectric film.

7. The acoustic wave filter of claim 1 wherein at least some of the respective film bulk acoustic wave resonators are disposed on a single substrate.

8. An acoustic wave filter assembly comprising:
   a first acoustic wave filter connected to a common node; and
   a second acoustic wave filter connected to the common node, at least one of the first acoustic wave filter and the second surface acoustic wave filter including the acoustic wave filter of claim 1.

9. The acoustic wave filter assembly of claim 8 further comprising:
   a third acoustic wave filter connected to the common node; and
   a fourth acoustic wave filter connected to the common node.

10. A wireless communication device comprising:
    an antenna; and
    a multiplexer coupled to the antenna, the multiplexer including a plurality of filters coupled to a common node and arranged to filter a radio frequency signal, at least one of the plurality of filters including a plurality of parallel arm resonators, and a plurality of series arm resonators, an electromechanical coupling coefficient of a parallel arm resonator closest to an input node of the at least one of the plurality of filters among the plurality of parallel arm resonators being smaller than an electromechanical coupling coefficient of a series arm resonator closest to the input node of the at least one of the plurality of filters among the plurality of series arm resonators, the plurality of parallel arm resonators and the plurality of series arm resonators being formed from film bulk acoustic wave resonators, each of the film bulk acoustic wave resonators including a substrate, a piezoelectric film supported over the substrate and over a cavity defined between the piezoelectric film and the substrate, and an electrode layer disposed on a surface of the piezoelectric film, the film bulk acoustic wave resonator of the parallel arm resonator closest to the input node including a first low propagation velocity region extending along a periphery of an active region of the piezoelectric film that can oscillate, and the film bulk acoustic wave resonator of the series arm resonator closest to the input node including a second low propagation velocity region extending along a periphery of an active region of the piezoelectric film that can oscillate, a width of the first low propagation velocity region being greater than a width of the second low propagation velocity region.

11. The wireless communication device of claim 10 wherein an electromechanical coupling coefficient of each of the film bulk acoustic wave resonators is a decreasing function of the width of the low propagation region in the respective film bulk acoustic wave resonator.

12. The wireless communication device of claim 10 wherein the parallel arm resonator closest to the input node includes a first raised frame portion extending along the periphery of the active region of the piezoelectric film that can oscillate, the first raised frame portion being formed by a portion of the electrode layer disposed on a top surface of the piezoelectric film, and the series arm resonator closest to the input node includes a second raised frame portion extending along the periphery of the active region of the piezoelectric film that can oscillate, in which the second raised frame portion is formed by a portion of the electrode layer disposed on a top surface of the piezoelectric film, a region of the piezoelectric film in which the first raised frame portion is formed and a region of the piezoelectric film in which the second raised frame portion is formed corresponding to the first low propagation velocity region and the second low propagation velocity region, respectively.

13. The wireless communication device of claim 12 wherein a width of the first raised frame portion is greater than a width of the second raised frame portion.

14. The wireless communication device of claim 12 wherein an electromechanical coupling coefficient of each of the film bulk acoustic wave resonators is a decreasing function of the width of the raised frame portion in the respective film bulk acoustic wave resonator.

15. The wireless communication device of claim 12 wherein each of the parallel arm resonator closest to the input node and the series arm resonator closest to the input node includes a recessed frame portion of the electrode layer, the recessed frame portion being adjacent to an inside of the raised frame portion of the electrode layer disposed on the top surface of the piezoelectric film.

16. The wireless communication device of claim 10 wherein at least some of the respective film bulk acoustic wave resonators are disposed on a single substrate.

* * * * *